United States Patent
Onihashi (10) Patent No.: US 9,331,111 B2
(45) Date of Patent: May 3, 2016

(54) METHOD OF REFRESH OPERATION FOR FLAT PANEL RADIATION IMAGER

(71) Applicant: Hiroshi Onihashi, Otawara (JP)

(72) Inventor: Hiroshi Onihashi, Otawara (JP)

(73) Assignees: Kabushiki Kaisha Toshiba, Minato-Ku, Tokyo (JP); Toshiba Electron Tubes & Devices Co., Ltd., Otawara-Shi, Tochigi (JP)

( * ) Notice: Subject to any disclaimer, the term of this patent is extended or adjusted under 35 U.S.C. 154(b) by 513 days.

(21) Appl. No.: 13/683,070

(22) Filed: Nov. 21, 2012

(65) Prior Publication Data

US 2013/0075592 A1    Mar. 28, 2013

Related U.S. Application Data

(63) Continuation of application No. PCT/JP2011/002849, filed on May 23, 2011.

(30) Foreign Application Priority Data

May 26, 2010    (JP) .................................. 2010-120381

(51) Int. Cl.

| | |
|---|---|
| *H01L 27/00* | (2006.01) |
| *H01J 40/14* | (2006.01) |
| *H01L 27/146* | (2006.01) |
| *G01T 1/20* | (2006.01) |
| *H04N 5/32* | (2006.01) |
| *H04N 5/374* | (2011.01) |
| *H04N 5/359* | (2011.01) |

(52) U.S. Cl.
CPC ........ *H01L 27/14612* (2013.01); *G01T 1/2018* (2013.01); *H01L 27/14658* (2013.01); *H04N 5/32* (2013.01); *H04N 5/3597* (2013.01); *H04N 5/374* (2013.01)

(58) Field of Classification Search
USPC ................ 250/208.1, 214 R, 214.1, 214 SW; 348/294, 302–304, 307–324; 257/290–292, 414, 431, 443
See application file for complete search history.

(56) References Cited

U.S. PATENT DOCUMENTS

| | | | |
|---|---|---|---|
| 2002/0186813 A1 | 12/2002 | Tamura et al. | |
| 2010/0134480 A1* | 6/2010 | Uchiyama | ..................... 345/214 |

FOREIGN PATENT DOCUMENTS

| | | | | |
|---|---|---|---|---|
| JP | 2001-074552 | * | 3/2001 | ................ G01J 1/44 |
| JP | 2001074552 A | | 3/2001 | |

(Continued)

OTHER PUBLICATIONS

International Search Report in corresponding Application No. PCT/JP2011/002849 mailed on Dec. 20, 2012, English Translation.

(Continued)

*Primary Examiner* — Pascal M Bui Pho
(74) *Attorney, Agent, or Firm* — Banner & Witcoff, Ltd.

(57) ABSTRACT

To provide a method of refresh operation for a flat panel radiation imager that makes it possible to carry out a refresh operation in such a way that electric charge that is accumulated in pixels by photoelectric conversion is efficiently released with low power consumption and during a short period of time. Control signals of the refresh operation are turned into a plurality of successive pulses at regular intervals; and timing is adjusted in a way that adjacent switching elements disposed on the same signal line are not turned ON at the same timing.

6 Claims, 6 Drawing Sheets

(56) References Cited

FOREIGN PATENT DOCUMENTS

| | | | | |
|---|---|---|---|---|
| JP | 2007-104219 | * | 4/2007 | ............... A61B 6/00 |
| JP | 2007104219 A | | 4/2007 | |

OTHER PUBLICATIONS

International Search Report in corresponding Application No. PCT/JP2011/002849 mailed on Jun. 14, 2011.
Apr. 2, 2015—(EP) Extended Search Report—App 11786312.6.

* cited by examiner

METHOD OF REFRESH OPERATION FOR FLAT PANEL RADIATION IMAGER

CROSS REFERENCES TO RELATED APPLICATIONS

This application is a continuation-in-part (CIP) application based upon the International Application PCT/JP2011/002849, the International Filing Date of which is May 23, 2011, the entire content of which is incorporated herein by reference, and is based upon and claims the benefits of priority from the prior Japanese Patent Applications No. 2010-120381, filed in the Japanese Patent Office on May 26, 2010, the entire content of which is incorporated herein by reference.

FIELD

Embodiments described herein relate generally to a method of so-called refresh operation for releasing electric charge that is accumulated in pixels of a flat panel radiation imager by, for example, photoelectric conversion.

BACKGROUND

An X-ray image pickup device that uses a flat panel detector (Flat Panel Imager: referred to as "FPI," hereinafter) has been put to practical use. The X-ray image pickup device that uses the FPI has some excellent advantages, such as having better sensitivity and image quality than an X-ray image pickup device that uses a film and being able to take a moving picture.

Figure 8:
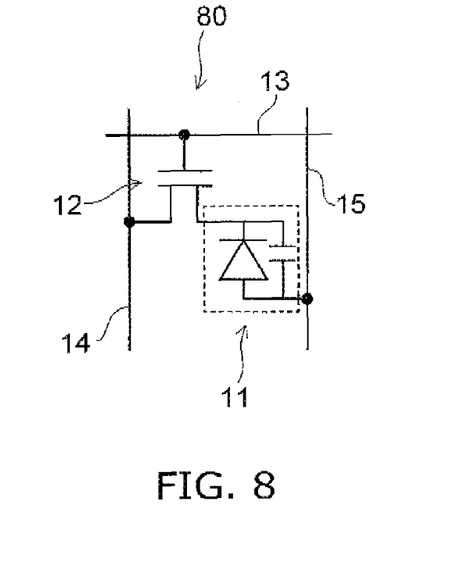
FIG. 8 is a diagram showing a circuit equivalent to the inside of a pixel.

As shown in FIG. 8, the FPI has a pixel 80 that includes a photoelectric conversion element 11 and a TFT (Thin Film Transistor) 12, which serves as a switching element. The TFT 12 is connected to a gate line 13, which is used to switch the TFT, as well as to a signal line 14, which is used to read a signal. The photoelectric conversion element 11 is connected to a bias line 15.

A TFT array substrate is formed by disposing a plurality of the above pixels 80 two-dimensionally on a glass substrate.

After a human body is irradiated with X-rays from an X-ray source, a fluorescent layer in the FPI converts the X-rays that have passed through the human body into visible light. Electrical charge is accumulated in the photoelectric conversion element 11 of the TFT array substrate. As the TFT 12 is turned ON (ON; closed circuit state), the accumulated charge is read from the photoelectric conversion element 11, and then is output via the signal line 14 as charge signals.

The charge signals are converted to electric signals. The electric signals are amplified by a plurality of signal amplification circuits before being converted by an analog/digital converter (A/D converter) into digital signals. The image data that have been converted into digital signals are processed by an image processing circuit into a moving image, which is then displayed on a monitor. An X-ray moving image pickup device is controlled by a control personal computer that is equipped with an image processing device, a program/control board, and the like. Video signals are operated repeatedly with the above process as one frame (See Patent Document 1, for example).

Figure 10:
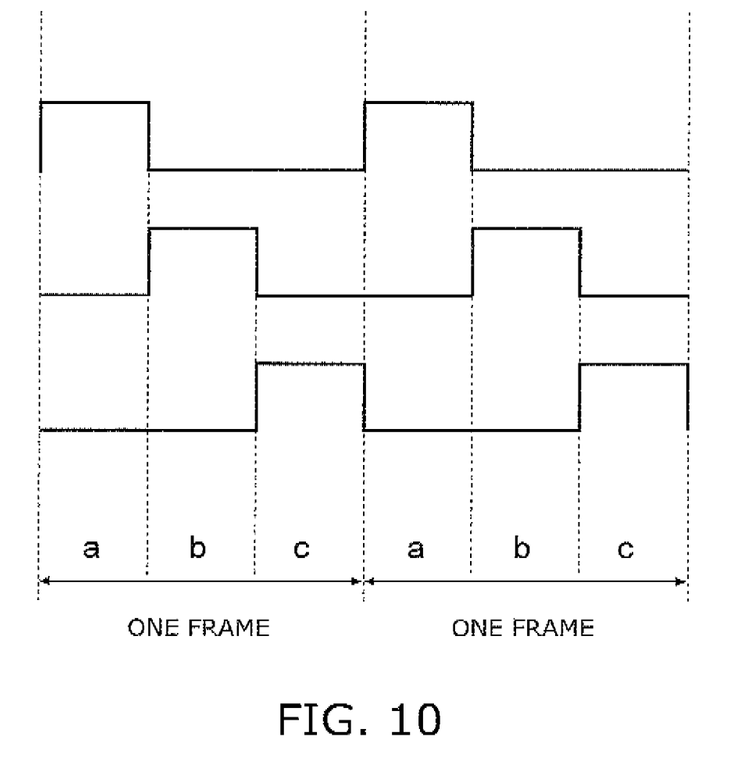
FIG. 10 is a timing chart of driving of a TFT on a per-frame basis.

FIG. 10 shows a timing chart of the driving of the TFT. The drive timing of the TFT has the following three timings: a period a during which electric charge is accumulated within one frame of image signals in response to X-rays; a period b during which the charge is read; and a period c during which the charge is refreshed.

In this manner, the charge that is accumulated in the period during which the charge should be accumulated is read from the photoelectric conversion element 11 after the TFT 12 is turned ON. However, the TFT 12 is not an ideal switch element. Therefore, some electric charge remains. Since the TFT 12 has a finite resistance value $R_{ON}$ (several mega ohms), the time constant that is determined between the TFT 12 and the capacitance $C_{PD}$ of the photoelectric conversion element 11 puts a restriction on the amount of charge that can be read.

Accordingly, in order to read a sufficient amount of charge, the time during which the TFT 12 is ON, or the charge reading period, needs to be longer. During the period, as the time during which the TFT 12 is ON becomes longer, the time during which the X-rays can be accumulated as signals (charge accumulation period) becomes shortened. As a result, sufficient output power cannot be obtained. On the other hand, if the time during which the TFT 12 is ON is short, a sufficient amount of charge cannot be read. As a result, the charge still remains in the next frame.

Therefore, an operation of switching the TFT 12 again to release the charge after the charge is read by turning the TFT 12 ON is carried out. The operation is called refresh.

Even during the refresh, the time during which the TFT 12 is ON needs to be long enough to release a sufficient amount of electric charge.

Figure 9:
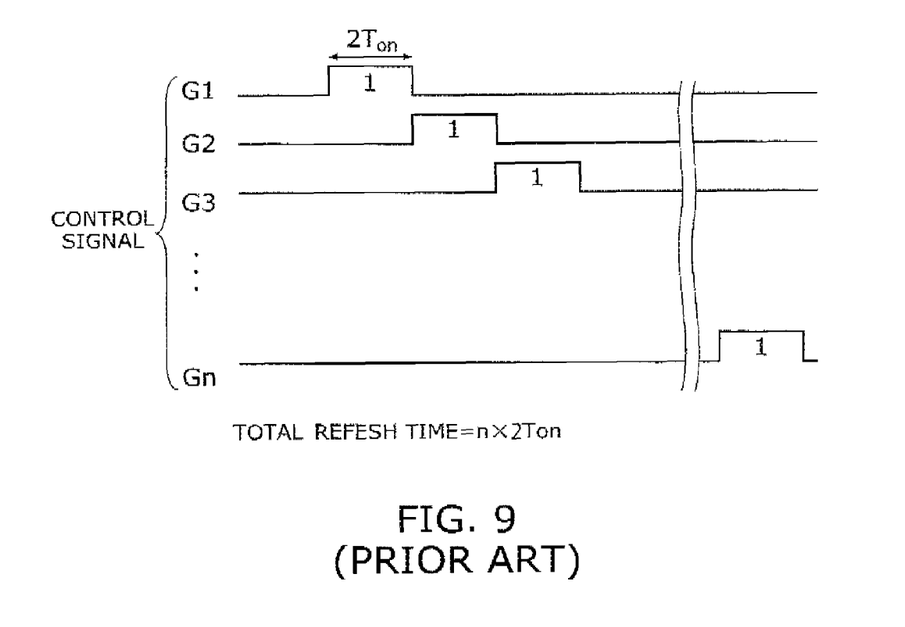
FIG. 9 is a timing chart showing a conventional refresh operation method.

FIG. 9 shows an example of a conventional refresh operation method.

According to the conventional refresh operation method, if the number of gate lines, $G_1$ to $G_n$, is n, one pulse of ON-control signal is input into $G_1$ with an interval of $2T_{ON}$.

Then, the timing is so controlled that the control signal of $G_2$ is turned ON at a time when the control signal of $G_1$ is turned OFF (OFF; closed circuit state). In this manner, one pulse of ON-control signal is similarly input with an interval of $2T_{ON}$.

Similarly, one pulse of control signal is sequentially input into $G_3$, $G_4$, . . . and then $G_n$. In this manner, the refresh operation is performed.

However, according to the conventional refresh operation method, if the time during which the TFT is ON is doubled or quadrupled, the total time required for the refresh becomes doubled or quadrupled as well.

That is, in the case of the conventional refresh timing, if the ON time for refresh is $2T_{ON}$, and the number of TFTs connected to the gate lines is n, the time required for the refresh is $2T_{ON} \times n$. Therefore, as the ON time becomes longer, the time becomes longer in proportion to the number of TFTs connected to the gate lines.

It is preferred that electric charge be released sufficiently even during a short refresh period. As a means for achieving the sufficient release of charge, a method of changing the polarity of voltage applied to the photoelectric conversion element 11, or the like is added.

However, according to the above method, the polarity of voltage applied to the photoelectric conversion element 11 needs to be changed on a per-frame basis. Therefore, the lack of stability in the operation is a problem.

Meanwhile, if the time during which the gate of the TFT 12 is ON is simply extended to ensure the time required for reading electric charge, and if an adjoining gate is opened even when a given gate is still opened, there is an increase in power consumption. Moreover, the electric charge at a time when the TFT 12 is ON is induced to a pixel that has been already turned ON. Accordingly, a large offset takes place. Therefore, the video turns unnatural.

BRIEF DESCRIPTION OF THE DRAWINGS

The above and other features and advantages of the present invention will become apparent from the discussion herein below of specific, illustrative embodiments thereof presented in conjunction with the accompanying drawings.

DETAILED DESCRIPTION

Now, embodiments of the working apparatus and working method according to the present invention will be described referring to the accompanying drawings. Throughout the drawings, the same or similar components are denoted respectively by the same reference symbols and will not be described repeatedly.

First Embodiment

Figure 1A:
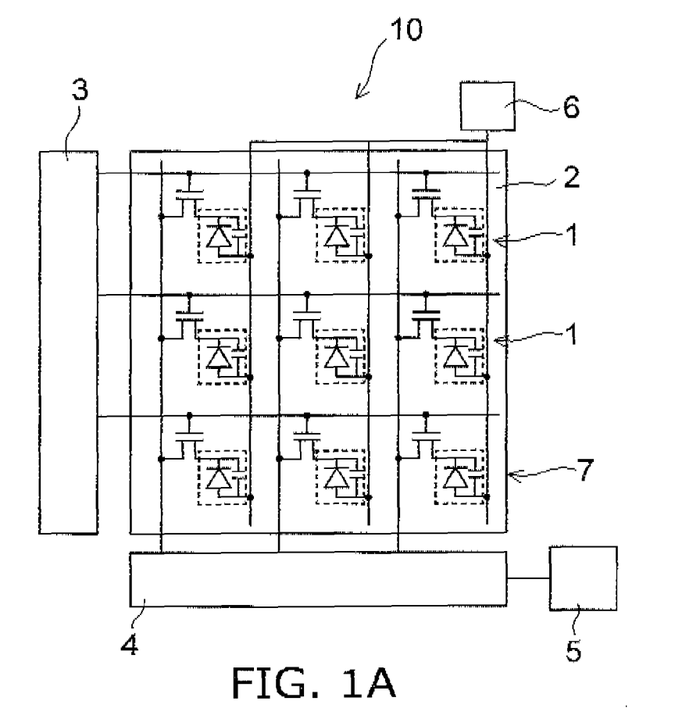
FIG. 1A is circuit diagrams showing one example of an X-ray flat panel imager that is used for a refresh operation method of an embodiment.
Figure 1B:
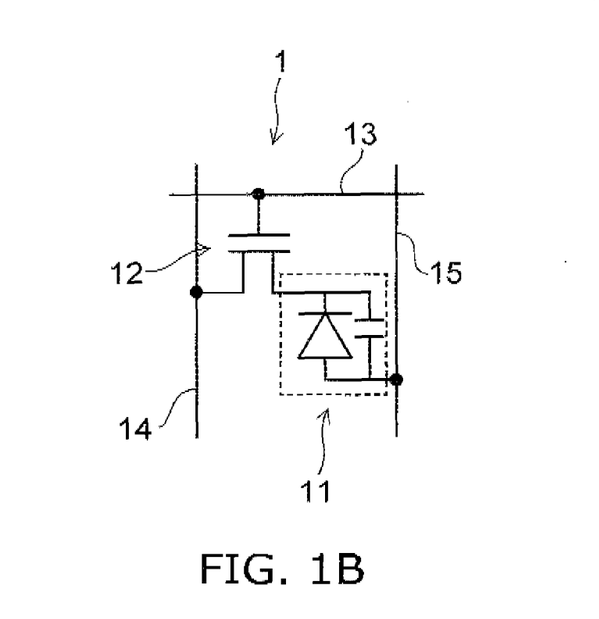
FIG. 1B is a diagram showing a circuit of a part of FIG. 1A.

FIG. 1 are circuit diagrams showing one example of a flat panel radiation imager that is used for a refresh operation method.

In FIG. 1A and FIG. 1B, in an X-ray flat panel imager 10, nine pixels 1 are disposed in a 3×3 matrix pattern on a glass substrate 2, forming a TFT array substrate 7.

The pixels 1 include a photoelectric conversion element 11, and a TFT 12, which serves as a switching element. The TFT 12 is connected to a gate line 13, which is used to switch the TFT, as well as to a signal line 14, which is used to read a signal. The photoelectric conversion element 11 is connected to a bias line 15.

On the periphery of the TFT array substrate 7, the following components are provided: a gate drive circuit 3, which is used to control the gate of the TFT; a signal detection circuit 4, which is used to convert charge signals from each pixel into electric signals; an image processing circuit 5; and a power source 6.

Figure 2:
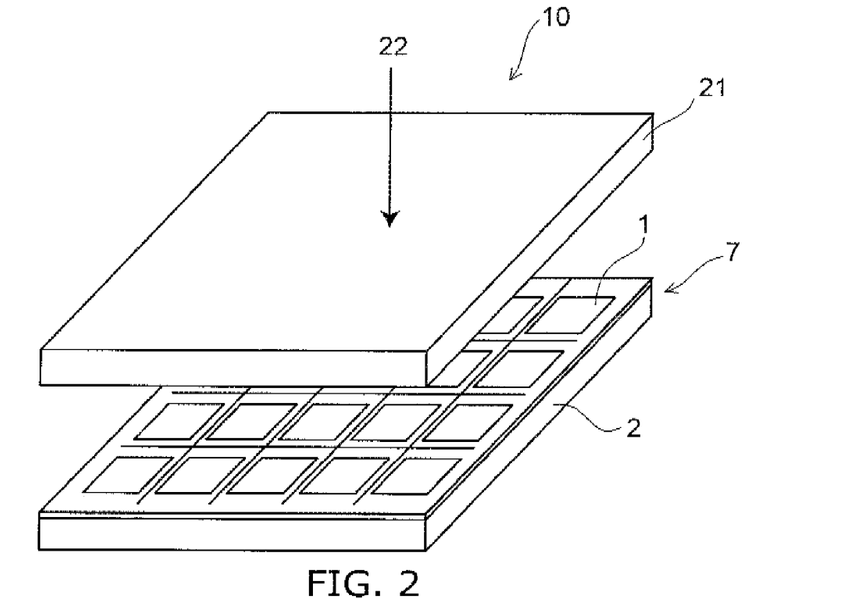
FIG. 2 is a schematic perspective view of assembling of the X-ray flat panel imager shown in FIG. 1A.

As shown in FIG. 2, in the X-ray flat panel imager 10, on an upper portion of the TFT array substrate 7, an X-ray light conversion layer 21 is mounted to convert an X-ray into light. The X-ray light conversion layer 21 converts an X-ray 22 into light. Then, the photoelectric conversion elements 11 convert the light into electric charge. The TFTs 12 are switched by the gate drive circuit 3 shown in FIG. 1A. The accumulated charge flows through the signal lines 14 before being detected by the signal detection circuit 4 as electric signals.

Figure 3:
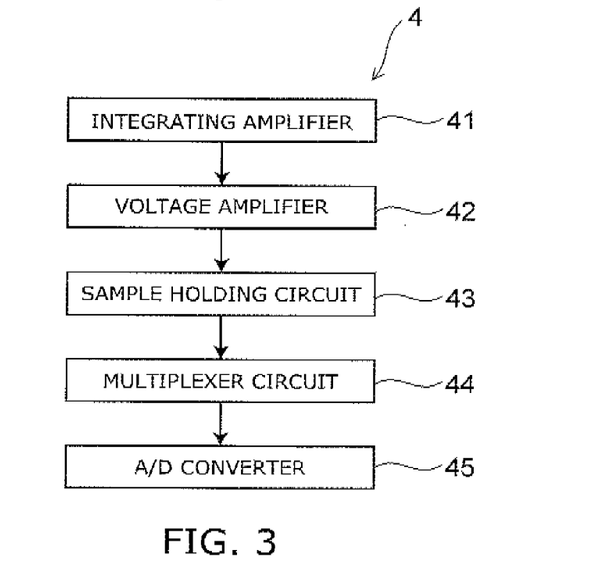
FIG. 3 is a diagram showing the configuration of a signal detection circuit of the X-ray flat panel imager shown in FIG. 1A.

FIG. 3 shows an example of the configuration of the signal detection circuit 4.

In the signal detection circuit 4, the charge signals from each pixel are converted by an integrating amplifier 41 into voltage. The voltage is amplified by an analog voltage amplifier. Then, after passing through the voltage amplifier 42, the voltage is sampled and held by a sample holding circuit 43. The processes during the above period are processed in parallel to each of the signal lines 14. One of the parallel-processed signals is selected by a multiplexer circuit 44, and is forced to pass through an A/D converter 45 so as to be converted into digital values. In the subsequent circuits not shown in the diagram, the rearranging of images, image processing, and other processes are carried out before the signals are output as image signals.

As the drive timings of the TFTs, as shown in FIG. 10, the following three timings are provided: a period a during which electric charge is accumulated; a period b during which the charge is read; and a period c during which the charge is refreshed.

During the charge accumulation period a, all TFT switching elements of the X-ray flat panel imager 10 are turned OFF so that charge is accumulated in the photoelectric conversion elements 11. After the accumulation, during the charge reading period b, the TFTs 12 are sequentially switched so that pixel signals are read. What is provided is a timing (refresh period c) at which, even though the TFTs 12 are switched after the charge reading period, the pixel signals that are not to be subjected to a subsequent image process as image signals are read and discarded.

The following describes the refresh operation method of the present embodiment.

The refresh operation method of the present embodiment is characterized in that gate scanning signals, or control signals during the refresh period, are allocated over time in a multi-pulse pattern. According to the present embodiment, the control signals that are output to one gate line are a plurality of successive pulses that appear at regular intervals.

Figure 4:
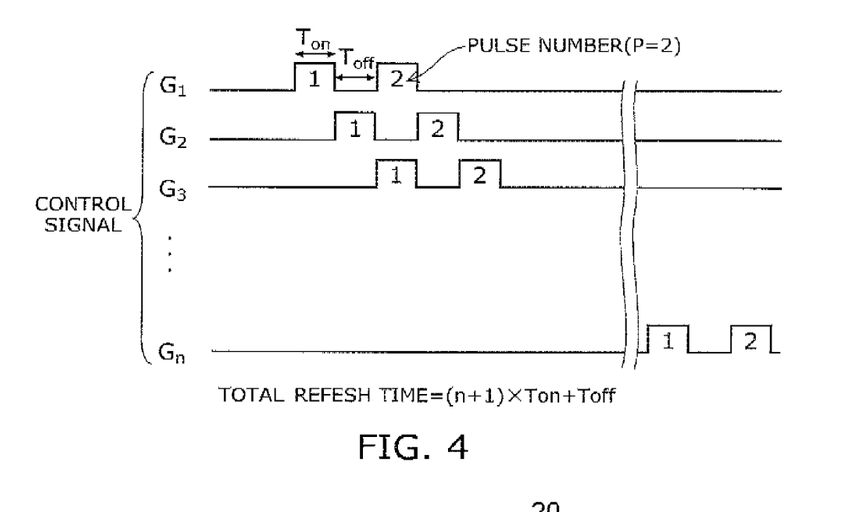
FIG. 4 is a timing chart showing a first embodiment of a refresh operation method.

That is, as shown in FIG. 4, the gate scanning signals associated with the refresh are turned into a multi-pulse pattern. The timing is so adjusted that the adjacent TFTs 12 on the same signal line 14 are not turned ON at the same time.

More specifically, an example is described in which the ON time is doubled as two pulses according to the present embodiment.

If the number of gate lines, $G_1$ to $G_n$, is n, first one pulse of ON-control signal is input into $G_1$ with an interval of $T_{on}$. Then, after an OFF signal is input with an interval of $T_{off}$, one pulse of ON-control signal is input again with an interval of $T_{on}$.

Then, the timing is so controlled that $G_2$ is turned ON at a time when $G_1$ is OFF. Similarly to $G_1$, two pulses are input into $G_2$. Then, the same processes are sequentially carried out for $G_3$, $G_4$, ..., and $G_n$.

In this case, the operation is so performed that a process of refreshing the TFTs 12 on the $m^{th}$ gate line (m<n) and a process of refreshing the TFTs 12 on the $m+1^{th}$ gate line do not take place at the same timing.

According to the present embodiment, when two pulses of $T_{on}$ are applied, the total time required for the refresh is: $(n+1) \times T_{on} + T_{off}$. When one pulse of $T_{on}$ is applied, the total time required for the refresh is $nT_{on}$. Therefore, even as the refresh time is doubled, the total time for the refresh is extended only by $T_{on} + T_{off}$. In this case, n is the number of gate lines.

The following takes a look at the case where Duty of ON/OFF of the TFTs 12 is 50%, the ON time of the TFTs 12 is $T_{on}$, the OFF time is $T_{off}$, the number of pulses is p, and the refresh time is multiplied by p. Then, the time required for the refresh is:

$$nT_{on}+(p-1)(T_{on}+T_{off}) \quad (1).$$

Accordingly, even as the refresh time is multiplied by p, the total time required for refreshing all gates is extended only by $(p-1)(T_{on}+T_{off})$. Moreover, the total time is not dependent on the number of TFTs connected to the gate lines. Furthermore, there is no induced charge to adjacent pixels, and the images are stable. In this manner, the highly advantageous effects can be obtained.

Meanwhile, according to a conventional refresh operation method, if the refresh time is multiplied by p, the time is: $p \times T_{on} \times n$.

The following makes a comparison with specific numbers. If the ON time is 10 μsec, and the gates are sequentially scanned, the total scanning time in the case of (100×100) pixels is: 10×100=1,000 μsec. In the case of 20 μsec, the total scanning time is:

$$20 \times 100 = 2,000 \text{ μsec.}$$

On the other hand, according to the refresh operation method of the present embodiment, when $T_{off}$ is 10 μsec, the total time that is calculated from the formula (1) is: 100×10+(2−1)×(10+10)=1,020 μsec. In this manner, during the refresh, even as the ON time of the TFTs is doubled, the total time required for the refresh is extended only by 20 μsec.

As described above, if the phase is so adjusted that a control ON signal G (n, p) that is applied to the $n^{th}$ gate line with a pulse number of p, and a control ON signal G (n+1, p) that is applied to the $n+1^{th}$ gate line with a pulse number of p are not turned ON during the same timing period, the electric charge accumulated in the photoelectric conversion elements can be efficiently refreshed without being affected by induced charge to adjacent pixels.

That is, the refresh operation can be carried out in such a way that the electric charge accumulated is efficiently released with low power consumption and during a short period of time.

Second Embodiment

Figure 5:
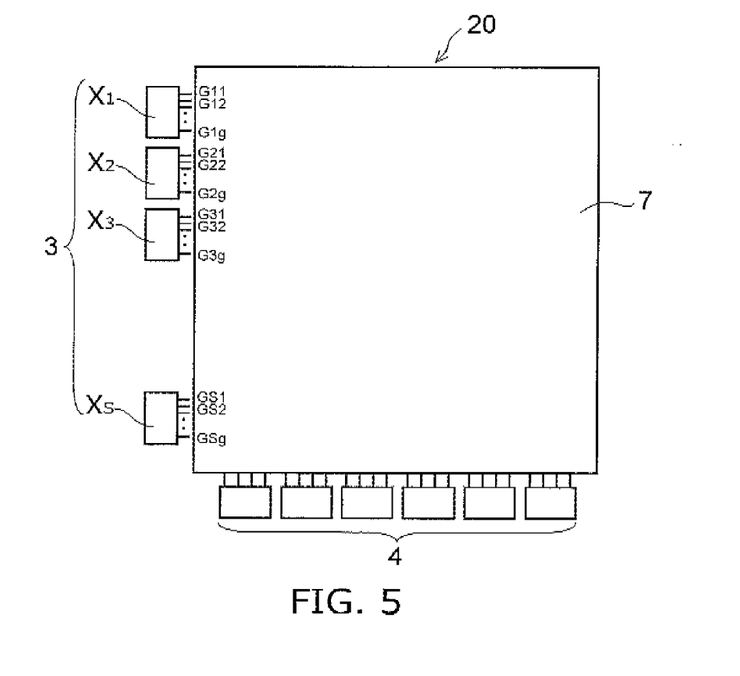
FIG. 5 is a schematic diagram showing another example of an X-ray flat panel imager that is used for a refresh operation method.

FIG. 5 is a schematic diagram showing another example of a flat panel radiation imager that is used for a refresh operation method during a refresh period in which image signals are read and discarded.

In an X-ray flat panel imager 20, the gate control circuit 3 includes a plurality of gate control elements $X_1$ to $X_s$. Each gate control element X is connected to the gate lines the number of which is g.

Figure 6:
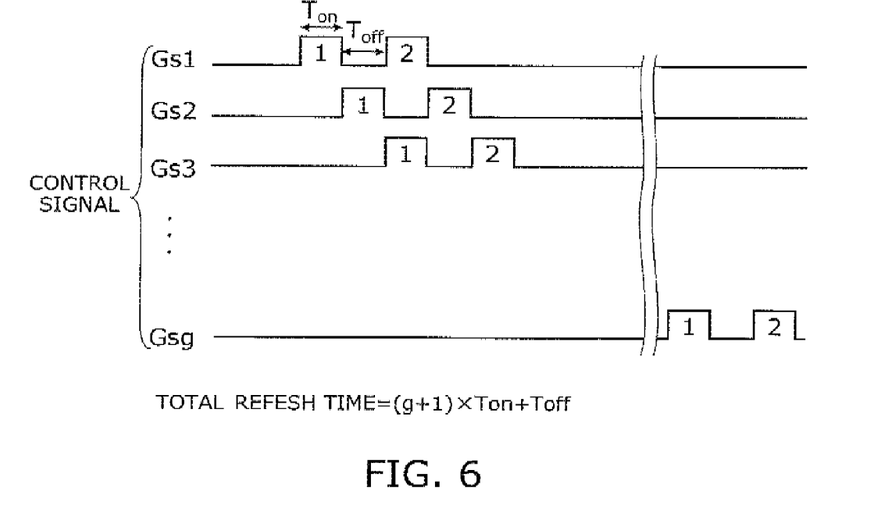
FIG. 6 is a timing chart showing a second embodiment of a refresh operation method.

FIG. 6 shows a method of driving gates at a time when a refresh operation is carried out using the X-ray flat panel imager 20 shown in FIG. 5.

During the refresh operation, each gate control element drives gates in the same way as in the first embodiment, as shown in FIG. 6. In this case, the gate control elements $X_1$ to $X_s$ are simultaneously driven. That is, a gate $G_{11}$ of the gate control element $X_1$, a gate $G_{21}$ of the gate control element $X_2$, a gate $G_{31}$ of the gate control element $X_3$, ..., and a gate $G_{s1}$ of the gate control element $X_s$ which all are the gates corresponding to the same position as shown in FIG. 5, are simultaneously driven by the control signal $G_{s1}$ shown in FIG. 6. A gate $G_{12}$ of the gate control element $X_1$, a gate $G_{22}$ of the gate control element $X_2$, a gate $G_{32}$ of the gate control element $X_3$, ..., and a gate $G_{s2}$ of the gate control element $X_s$ are simultaneously driven by the control signal $G_{s2}$ shown in FIG. 6. The same operation is sequentially carried out for gates $G_{1g}$ of the gate control element $X_1$, gates $G_{2g}$ of the gate control element $X_2$, gates $G_{3g}$ of the gate control element $X_3$, ..., and gates $G_{sg}$ of the gate control element $X_s$.

During the refresh operation, refreshing is carried out on a per-gate basis. Therefore, without the effects of induced charge to adjacent pixels, the charge can be removed. Another advantage is that the refresh time is short as refreshing is performed on a per-gate-control-element basis.

Furthermore, if the pulse width of the refresh period is made shorter than the pulse width of the charge reading period during which pixel signals are read, and is turned into a multi-pulse pattern for refreshing, residual electric charge that is accumulated in the photoelectric conversion elements can be removed for a shorter period of time, thereby bringing about an equilibrium state. According to the present embodiment, the refresh operation can be carried out in such a way that the electric charge that is accumulated in pixels by photoelectric conversion is efficiently released with low power consumption and during a short period of time.

Third Embodiment

Figure 7:
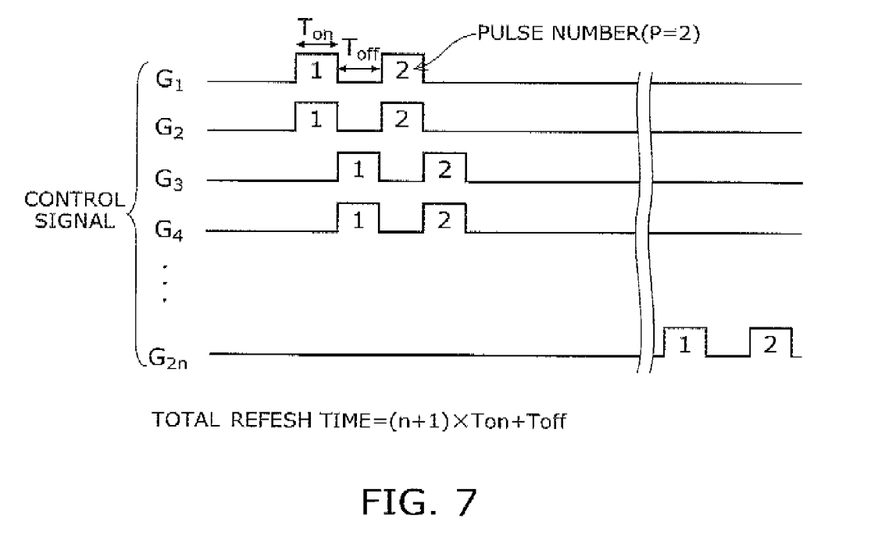
FIG. 7 is a timing chart showing a third embodiment of a refresh operation method.

FIG. 7 shows another embodiment of a refresh operation method.

During the refresh operation, refresh driving is carried out in a pixel addition mode.

The pixel addition mode is a mode in which the adjacent gate lines are turned ON at the same time, and the electric charge is added to one signal line 14 before being read.

According to the present embodiment, what is illustrated is one example in which refreshing is performed with two pulses.

As for the refreshing timing in the pixel addition mode, an odd-numbered gate line and an even-numbered gate line, or adjacent even- and odd-numbered gate lines, are regarded as one unit when the timing control is carried out with the same control signal. The phases of a plurality of control ON signals G(2n, p) on the $2n^{th}$ gate line, and the phases of a plurality of control ON signals G(2(n+1), p) on the $2(n+1)^{th}$ gate line are so adjusted that the gates are not turned ON during the same timing period.

According to the present embodiment, even in the pixel addition mode, without being affected by induced charge to adjacent pixels, the electric charge accumulated in the photoelectric conversion elements can be refreshed in an efficient manner. Another advantage is that the total refresh time is only $(n+1) \times T_{on} + T_{off}$. Thus, the refresh operation can be carried out in such a way that the electric charge that is accumulated in pixels by photoelectric conversion is efficiently released with low power consumption and during a short period of time.

While certain embodiments have been described, these embodiments have been presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of refresh operation for a flat panel radiation imager including: a substrate, a plurality of pixels containing photoelectric conversion elements and switching elements two-dimensionally arranged, gate lines connected to a gate control circuit and switching the switching elements by control signals from the gate control circuit, and signal lines connected to a signal detection circuit and reading pixel signals from the photoelectric conversion elements on the substrate, wherein the switching elements are turned ON to perform a process of reading electric charge accumulated in the pixels and image processing and after the processing a refresh operation is carried out to release residual electric charge in the pixels by turning the switching elements ON, comprising:

applying the control signals with a plurality of successive pulses at regular intervals to each of the gate lines; and adjusting timing of the control signals in a way that the adjacent switching elements on the same signal line are not turned ON at the same timing, and wherein when the number of the gate lines is 2n, and the number of pulses is p, a phase of the pulses is adjusted in a way that a control ON signal G (2m, p) applied to the $2m^{th}$ gate line (2m<2n) with a pulse number of p, and a control ON signal G (2(m+1), p) applied to the $2(m+1)^{th}$ gate line (2(m+1)≤2n) with a pulse number of p are not turned ON during the same timing period, and a part of a control ON signal G (2m, p) applied to the $2m^{th}$ gate line (2m<2n) with a pulse number of p, and a part of a control ON signal G (2(m+2), p) applied to the $2(m+2)^{th}$ gate line (2(m+2)≤2n) with a pulse number of (p−1) are turned ON during the same timing period.

2. The method of refresh operation for the flat panel radiation imager according to claim 1, wherein the gate control circuit includes a plurality of gate control elements connected to a plurality of the gate lines; the refresh operation is performed for each of the gate control elements; and the same control signal is simultaneously driven on a gate line corresponding to the same position of each of the gate control elements.

3. The method of refresh operation for the flat panel radiation imager according to claim 1, wherein a pulse width of the refresh operation is shorter than a width of pulse for reading electric charge accumulated in the pixels at the time of image processing.

4. A method of refresh operation for a flat panel radiation imager including: a substrate, a plurality of pixels containing photoelectric conversion elements and switching elements two-dimensionally arranged, gate lines connected to a gate control circuit and switching the switching elements by control signals from the gate control circuit, and signal lines connected to a signal detection circuit and reading pixel signals from the photoelectric conversion elements on the substrate, wherein the switching elements are turned ON to perform a process of reading electric charge accumulated in the pixels and image processing and after the processing a refresh operation is carried out to release residual electric charge in the pixels by turning the switching elements ON, comprising:

applying the control signals with a plurality of successive pulses at regular intervals to each of the gate lines; and adjusting timing of the control signals in a way that the adjacent switching elements on the same signal line are not turned ON at the same timing, and wherein when the number of the gate lines is n, and the number of pulses is p, a phase of the pulses is adjusted in a way that a control ON signal G (m,p) applied to the $m^{th}$ gate line (m<n) with a pulse number of p, and a control ON signal G (m+1, p) applied to the $m+1^{th}$ gate line (m+1≤n) with a pulse number of p are not turned ON during the same timing period, and a part of a control ON signal G (m, p) applied to the $m^{th}$ gate line (m<n) with a pulse number of p, and a part of a control ON signal G (m+2, p) applied to the $m+2^{th}$ gate line (m+2≤n) with a pulse number of (p−1) are turned ON during the same timing period.

5. The method of refresh operation for the flat panel radiation imager according to claim 4, wherein:

the gate control circuit includes a plurality of gate control elements connected to a plurality of the gate lines; the refresh operation is performed for each of the gate control elements; and the same control signal is simultaneously driven on a gate line corresponding to the same position of each of the gate control elements.

6. The method of refresh operation for the flat panel radiation imager to claim 4, wherein a pulse width of the refresh operation is shorter than a width of pulse for reading electric charge accumulated in the pixels at the time of image processing.

* * * * *